US012652985B2

(12) United States Patent
Park et al.

(10) Patent No.: US 12,652,985 B2
(45) Date of Patent: Jun. 9, 2026

(54) APPARATUS FOR TREATING SUBSTRATE

(71) Applicant: SEMES CO., LTD., Cheonan-si (KR)

(72) Inventors: Mi So Park, Daejeon (KR); Young Hun Lee, Cheonan-si (KR); Young Seop Choi, Cheonan-si (KR); Jin Woo Jung, Cheonan-si (KR)

(73) Assignee: Semes Co., LTD., Cheonan-si (KR)

( * ) Notice: Subject to any disclaimer, the term of this patent is extended or adjusted under 35 U.S.C. 154(b) by 1060 days.

(21) Appl. No.: 17/745,074

(22) Filed: May 16, 2022

(65) Prior Publication Data

US 2022/0367213 A1 Nov. 17, 2022

(30) Foreign Application Priority Data

May 17, 2021 (KR) ........................ 10-2021-0063445

(51) Int. Cl.
*H10P 72/00* (2026.01)
*B08B 3/02* (2006.01)
(Continued)

(52) U.S. Cl.
CPC ............ *H10P 72/0414* (2026.01); *F26B 3/04* (2013.01); *H10P 72/0402* (2026.01); (Continued)

(58) Field of Classification Search
CPC ...... F26B 3/04; F26B 5/005; H01L 21/67051; H01L 21/67017; H01L 21/67034; (Continued)

(56) References Cited

U.S. PATENT DOCUMENTS

| | | | |
|---|---|---|---|
| 2008/0026443 A1 | 1/2008 | Offerman et al. | |
| 2021/0104418 A1* | 4/2021 | Park ................. | H01L 21/67017 |

FOREIGN PATENT DOCUMENTS

| | | |
|---|---|---|
| JP | 2007175559 A | 7/2007 |
| JP | 2021-061400 A | 4/2021 |
| KR | 10-2016-0095657 A | 8/2016 |
| KR | 2020-0044240 A | 4/2020 |
| KR | 2021/0040201 A | 4/2021 |

OTHER PUBLICATIONS

Office Action dated Nov. 29, 2022, issued in corresponding Korean Patent Application No. 10-2021-0063445.

(Continued)

*Primary Examiner* — Jessica Yuen
(74) *Attorney, Agent, or Firm* — Harness, Dickey & Pierce, P.L.C.

(57) ABSTRACT

The inventive concept provides a substrate treating apparatus. The substrate treating apparatus includes a chamber having an inner space therein; a fluid supply unit having a supply line configured to supply a treating fluid to the inner space and a fluid supply source configured to supply the treating fluid to the supply line; a first exhaust unit configured to exhaust the inner space; a second exhaust unit configured to exhaust the supply line; and a controller configured to control the fluid supply unit, the first exhaust unit, and the second exhaust unit, and wherein the controller controls the fluid supply unit and the second exhaust unit so a pressure of the supply line is maintained at a critical pressure of the treating fluid or above during at least a part of a standby step for keeping a substrate outside the inner space before introducing thereof into the inner space.

14 Claims, 14 Drawing Sheets

(51) Int. Cl.
  B08B 3/08 (2006.01)
  F26B 3/04 (2006.01)
  H10P 72/30 (2026.01)
(52) U.S. Cl.
  CPC ...... H10P 72/0408 (2026.01); H10P 72/0432 (2026.01); H10P 72/0434 (2026.01); H10P 72/0456 (2026.01); H10P 72/0462 (2026.01); H10P 72/0604 (2026.01); H10P 72/3212 (2026.01); B08B 3/022 (2013.01); B08B 3/08 (2013.01)
(58) Field of Classification Search
  CPC ......... H01L 21/67103; H01L 21/67173; H01L 21/6719; H01L 21/67253; H01L 21/67109; H01L 21/67721; B08B 3/022; B08B 3/08; H10P 72/0414; H10P 72/0402; H10P 72/0408; H10P 72/0432; H10P 72/0434; H10P 72/0456; H10P 72/0462; H10P 72/0604; H10P 72/3212
  See application file for complete search history.

(56) References Cited

OTHER PUBLICATIONS

Office Action for Korean Application No. 10-2024-0081571 dated Mar. 21, 2025.
Japanese Office Action, dated Jul. 18, 2023, issued in corresponding Japanese Patent Application No. 2022-079297.
Office Action for Japanese Application No. 2022-079297 dated Feb. 20, 2024.

* cited by examiner

| Liquid Treating Step | ~S10 |

↓

| Transfer Step | ~S20 |

↓

| Drying Step | ~S30 |

APPARATUS FOR TREATING SUBSTRATE

CROSS-REFERENCE TO RELATED APPLICATIONS

A claim for priority under 35 U.S.C. § 119 is made to Korean Patent Application No. 10-2021-0063445 filed on May 17, 2021, in the Korean Intellectual Property Office, the entire contents of which are hereby incorporated by reference.

BACKGROUND

Embodiments of the inventive concept described herein relate to a substrate treating apparatus.

In order to manufacture a semiconductor device, various processes such as a photolithography process, an etching process, an ashing process, an ion implantation process, and a thin film deposition process are performed on a substrate such as a wafer. Various treating liquids and treating gases are used in each process. In addition, in order to remove a treating liquid used to treat the substrate from the substrate, a drying process is performed on the substrate.

Conventionally, a drying process for removing the treating liquid from the substrate includes a rotation drying process for rotating the substrate at a high speed and removing a treating liquid remaining on the substrate by a centrifugal force of a rotation of the substrate. However, in such a rotation drying method, there is a high risk that a leaning phenomenon may occur in a pattern formed on the substrate. Recently, a supercritical drying process is being used as a method for drying the substrate. In the supercritical drying process, the substrate is taken into a chamber capable of maintaining a high pressure and a high temperature atmosphere, and then a carbon dioxide in a supercritical state is supplied onto the substrate to remove the treating liquid (e.g., an organic solvent, a developing liquid solvent, etc.). The carbon dioxide in the supercritical state has a high solvency and a high permeability. When the carbon dioxide in the supercritical state is supplied onto the substrate, the carbon dioxide easily permeates into the treating liquid remaining between a pattern on the substrate. Accordingly, a treating liquid remaining between the pattern on the substrate is easily removed from the substrate.

In order for the carbon dioxide to maintain the supercritical state, an atmosphere in the chamber in which the supercritical drying process is performed should be maintained at a high pressure. In other words, the supercritical drying process includes a pressurization process that compresses the atmosphere in the chamber and a decompression process that returns the atmosphere in the chamber to the normal pressure to take out the substrate from the chamber. When the atmosphere in the chamber is returned to the normal pressure, the substrate is taken out from the chamber. When the substrate is taken out from the chamber, the substrate treating apparatus maintains a standby state until a substrate to be subjected to a subsequent supercritical drying process is taken in.

Meanwhile, in order to increase a treating efficiency of the substrate (for example, in order to reduce a frequency of process defects occurred), it is important to maintain a condition of the substrate treating apparatus similar to a condition when the supercritical drying process is performed. However, if this standby state continues for a long time, the condition of the substrate treating apparatus (e.g., a temperature within the chamber, a temperature of a pipe supplying the carbon dioxide to the chamber, etc.) changes.

When the condition of the substrate treating apparatus changes, a deviation in a degree of a drying occurs between treated substrates.

Conventionally, when the standby state continues for a long time, the carbon dioxide is supplied into the chamber without taking in the substrate into order to maintain the condition of the substrate treating apparatus, and the carbon dioxide is discharged from the chamber. A supply and a discharge of the carbon dioxide is performed in a manner similar to the supercritical drying process. However, this method consumes a lot of the carbon dioxide. In addition, since the substrate treating apparatus is driven in a manner similar to an actual supercritical drying process, a consumption cycle of the components of the substrate treating apparatus is shortened.

SUMMARY

Embodiments of the inventive concept provide a substrate treating apparatus for improving a substrate treating efficiency.

Embodiments of the inventive concept provide a substrate treating apparatus and a control method of the substrate treating apparatus for minimizing a treating deviation between substrates.

Embodiments of the inventive concept provide a substrate treating apparatus and a control method of the substrate treating apparatus for minimizing an excessive consumption of a treating fluid, when maintaining a condition of the substrate treating apparatus at a standby step to be similar to a condition of the substrate treating apparatus at a treating step.

Embodiments of the inventive concept provide a substrate treating apparatus and a control method of the substrate treating apparatus for minimizing an excessive consumption of a carbon dioxide, when maintaining a condition of a supply line of the substrate treating apparatus at a standby step to be similar to a condition of the supply line at a drying step.

The inventive concept provides a substrate treating apparatus. The substrate treating apparatus includes a chamber having an inner space therein; a fluid supply unit having a supply line configured to supply a treating fluid to the inner space and a fluid supply source configured to supply the treating fluid to the supply line; a first exhaust unit configured to exhaust the inner space; a second exhaust unit configured to exhaust the supply line; and a controller configured to control the fluid supply unit, the first exhaust unit, and the second exhaust unit, and wherein the controller controls the fluid supply unit and the second exhaust unit so a pressure of the supply line is maintained at a critical pressure of the treating fluid or above during at least a part of a standby step for keeping a substrate outside the inner spacer before introducing thereof into the inner space.

In an embodiment, the controller, when the pressure of the supply line becomes lower than the critical pressure, controls the fluid supply unit so the fluid supply source supplies the treating fluid to the supply line during the at least a part of the standby step.

In an embodiment, the fluid supply unit further comprises a heater installed at the supply line and configured to heat the treating fluid within the supply line.

In an embodiment, the controller controls the fluid supply unit so the heater continuously heats the supply line during the standby step.

In an embodiment, the supply line comprises: a main supply line connected to the fluid supply source; a first supply line branching from the main supply line and connected to the chamber; and a second supply line branching from the main supply line and connected to the chamber at a location different from the first supply line, and wherein the fluid supply unit further comprises: a main valve installed at the main supply line; a first valve installed at the first supply line; and a second valve installed at the second supply line, and wherein the heater is installed between the main valve, the first valve, and the second valve.

In an embodiment, the heater is installed at the main supply line, the first supply line, and the second supply line, respectively.

In an embodiment, the controller controls: the fluid supply unit and the first exhaust unit to perform the standby step and a treating step for treating the substrate in turns; the second exhaust unit so the pressure of the supply line becomes a normal pressure by exhausting the supply line during a predetermined time before the treating step begins; and the second exhaust unit so a length of time in the standby step when the pressure of the supply line is maintained at a pressure above the critical pressure is longer than a length of time in the standby step required for the pressure of the supply line to become the normal pressure.

In an embodiment, the controller controls the fluid supply unit and the second exhaust unit so the treating step comprises a pressurization step for increasing a pressure of the inner space and a decompression step for reducing the pressure of the inner space to a normal pressure after the pressurization step, the pressure of the supply line being maintained at the critical pressure or greater from at least a part of the pressurizing step to at least a part of the standby step.

The inventive concept provides a substrate treating apparatus. The substrate treating apparatus includes a chamber having an inner space therein; a fluid supply unit having a supply line configured to supply a treating fluid to the inner space and a heater configured to heat the supply line; a first exhaust unit configured to exhaust the inner space; a second exhaust unit configured to exhaust the supply line; and a controller configured to control the fluid supply unit, the first exhaust unit, and the second exhaust unit, and wherein the controller controls the fluid supply unit, the first exhaust unit, and the second exhaust unit so the heater heats the supply line having a remaining treating fluid, during a predetermined time after a substrate is taken out from the inner space.

In an embodiment, the controller controls the fluid supply unit, the first exhaust unit, and the second exhaust unit to perform, a drying step for drying a substrate with the treating fluid at the inner space, and a standby step for standing by for an introduction of a substrate into the inner space and including a predetermined time.

In an embodiment, the controller controls the fluid supply unit, the first exhaust unit, and the second exhaust unit so a pressure of the supply line is maintained at a predetermined pressure during the predetermined time.

In an embodiment, the controller controls the fluid supply unit so the predetermined pressure reaches a critical pressure or above to maintain a supercritical state of the treating fluid at the supply line.

In an embodiment, the controller controls the fluid supply unit to supply the treating fluid to the supply line when the pressure of the supply line becomes lower than the predetermined pressure.

In an embodiment, the supply line comprises: a main supply line connected to a fluid supply source storing the treating fluid; a first supply line branching from the main supply line and connected to the chamber; and a second supply line branching from the main supply lune and connected to the chamber at a location different from the first supply line, and wherein the fluid supply unit further comprises: a main valve installed at the main supply line; a first valve installed at the first supply line; and a second valve installed at the second supply line, and wherein the controller controls the fluid supply unit to close the main valve, the first valve, and the second valve during the drying step so the main valve, the first valve, and the second valve is closed during least a part of a time during the drying step and during the predetermined time.

The inventive concept provides a substrate treating apparatus for dry treating a substrate using a treating fluid in a supercritical state. The substrate treating apparatus includes a chamber having an inner space therein; a fluid supply unit having a supply line configured to supply the treating liquid to the inner space; a first exhaust unit configured to exhaust the inner space; a second exhaust unit configured to exhaust the supply line; and a controller controlling the fluid supply unit, the first exhaust unit, and the second exhaust unit, and wherein the fluid supply unit comprises: a fluid supply source configured to transfer the treating fluid to the supply line; a heater installed at the supply line; and a valve installed at the supply line, and wherein the supply line comprises: a main supply line connected to the fluid supply source; a first supply line branching from the main supply line; and a second supply branching from the main supply line, and connected to the first supply line at a position different from the first supply line, and wherein the fluid supply unit comprises: a main valve installed at the main supply line; a first valve installed at the first supply line; and a second valve installed at the second supply line, and wherein the controller comprises: a drying step for drying the substrate with a treating fluid at the inner space; and a standby step for standing by an introduction of the substrate after the substrate is taken out from the inner space, and wherein the controller controls the fluid supply unit, the first exhaust unit, and the second exhaust unit so a drying step for drying the substrate with the treating fluid in the inner space; and a standby step for standing by for an introduction of a substrate after the substrate is taken out from the inner space is performed, and the main valve, the first valve, and the second valve are closed during at least a part of a time during the standby step.

In an embodiment, the heater heats the supply line having the treating liquid remaining therein between the main valve, the first valve, and the second valve.

In an embodiment, the heater heats the supply line while the standby step is being performed.

In an embodiment, the controller controls the fluid supply unit, and first exhaust unit, and the second exhaust unit so a pressure of the supply line having the treating fluid remaining therein between the main valve, the first valve, and the second valve is maintained at a predetermined pressure.

In an embodiment, the controller controls the fluid supply unit so the predetermined pressure reaches a critical pressure or above to maintain a supercritical state of the treating fluid at the supply line.

In an embodiment, the fluid supply unit further comprises a pressure sensor positioned downstream of the main valve and upstream of the first valve or the second valve, and wherein the controller controls the fluid supply unit to open the main valve and supply the treating fluid through the supply line, when a pressure value measured by the pressure sensor is lower than the predetermined pressure during when the main valve, the first valve, and second valve is closed.

According to an embodiment of the inventive concept, a substrate may be efficiently treated.

According to an embodiment of the inventive concept, a treating deviation between substrates may be minimized.

According to an embodiment of the inventive concept, when maintaining a condition of the substrate treating apparatus at a standby step to be similar to a condition of the substrate treating apparatus at a treating step, an excessive consumption of a treating fluid may be minimized.

According to an embodiment of the inventive concept, when maintaining a condition of a supply line of the substrate treating apparatus at a standby step to be similar to a condition of the supply line at a drying step, an excessive consumption of a carbon dioxide may be minimized.

The effects of the inventive concept are not limited to the above-mentioned ones, and the other unmentioned effects will become apparent to those skilled in the art from the following description.

BRIEF DESCRIPTION OF THE FIGURES

The above and other objects and features will become apparent from the following description with reference to the following figures, wherein like reference numerals refer to like parts throughout the various figures unless otherwise specified, and wherein:

FIG. 4 is a flowchart illustrating a substrate treating method according to an embodiment of the inventive concept.

FIG. 11 illustrates a state in which the substrate treating apparatus is driven in t3 to t34 of FIG. 8.

FIG. 12 illustrates a state in which the substrate treating apparatus is driven in t34 to t4 of FIG. 8.

DETAILED DESCRIPTION

Figure 1:
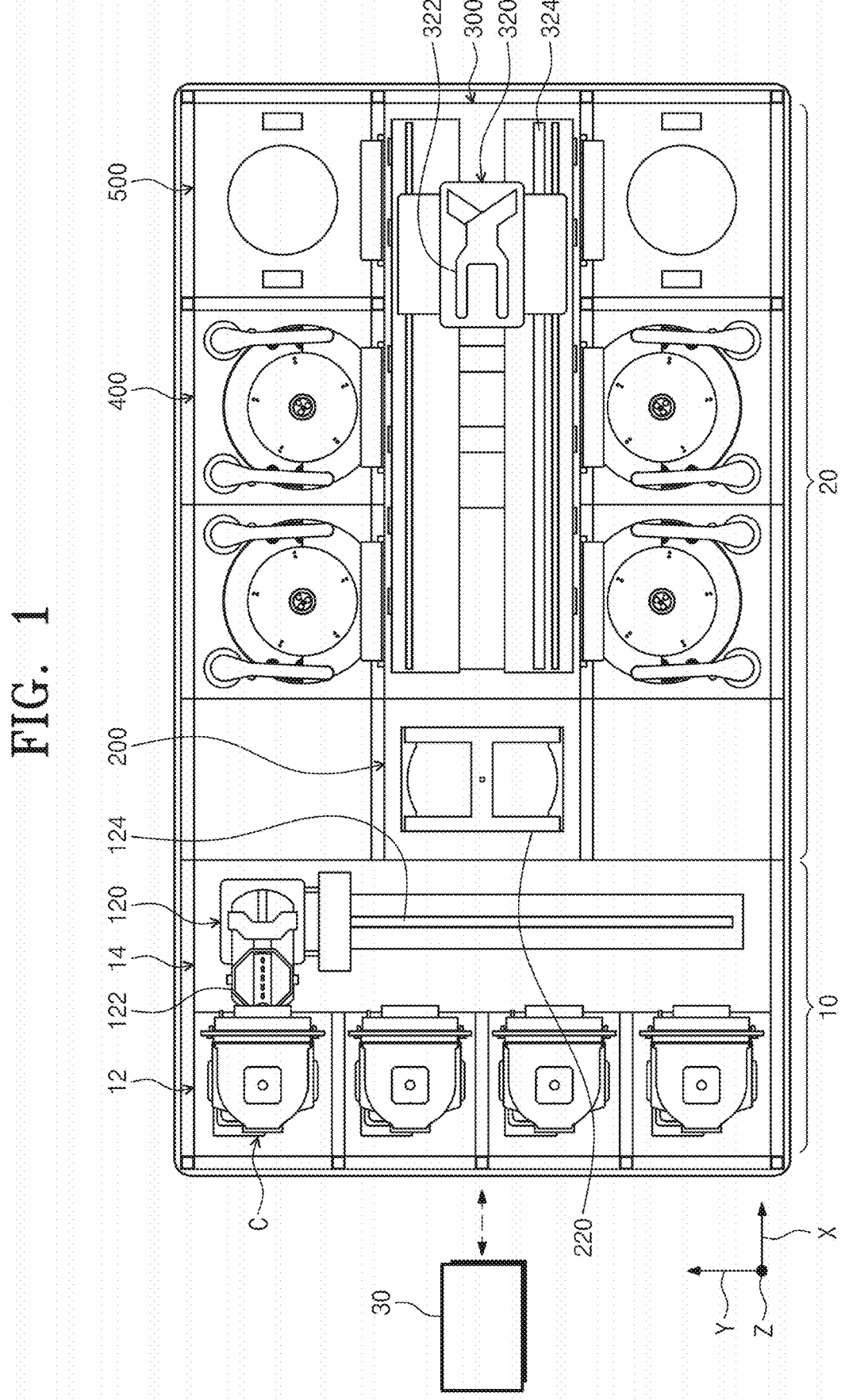
FIG. 1 is a plan view schematically illustrating a substrate treating apparatus according to an embodiment of the inventive concept.

The inventive concept may be variously modified and may have various forms, and specific embodiments thereof will be illustrated in the drawings and described in detail. However, the embodiments according to the concept of the inventive concept are not intended to limit the specific disclosed forms, and it should be understood that the present inventive concept includes all transforms, equivalents, and replacements included in the spirit and technical scope of the inventive concept. In a description of the inventive concept, a detailed description of related known technologies may be omitted when it may make the essence of the inventive concept unclear.

The terminology used herein is for the purpose of describing particular embodiments only and is not intended to be limiting of the inventive concept. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Also, the term "exemplary" is intended to refer to an example or illustration.

It will be understood that, although the terms "first", "second", "third", etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the inventive concept.

It should be understood that when an element or layer is referred to as being "on," "connected to," "coupled to," or "covering" another element or layer, it may be directly on, connected to, coupled to, or covering the other element or layer or intervening elements or layers may be present. In contrast, when an element is referred to as being "directly on," "directly connected to," or "directly coupled to" another element or layer, there are no intervening elements or layers present. Other terms such as "between", "adjacent", "near" or the like should be interpreted in the same way.

Unless otherwise defined, all terms used herein, including technical or scientific terms, have the same meaning as those generally understood by those skilled in the art to which the inventive concept belongs. Terms such as those defined in commonly used dictionaries should be interpreted as consistent with the context of the relevant technology and not as ideal or excessively formal unless clearly defined in this application.

Hereinafter, an embodiment of the inventive concept will be described with reference to FIG. 1 to FIG. 13.

FIG. 1 is a plan view schematically illustrating a substrate treating apparatus according to an embodiment of the inventive concept.

Referring to FIG. 1, the substrate treating apparatus includes an index module 10, a treating module 20, and a controller 30. When viewed from above, the index module 10 and the treating module 20 are disposed in a direction. Hereinafter, a direction in which the index module 10 and the treating module 20 are disposed is referred to as a first direction X, a direction perpendicular to the first direction X when viewed from above is referred to as a second direction Y, and a direction perpendicular to both the first direction X and the second direction Y is referred to as a third direction Z.

The index module 10 transfers the substrate W from a container C in which the substrate W is stored to the treating module 20, and stores a substrate W in which a treatment has been completed at the treating module 20 to the container C. A lengthwise direction of the index module 10 is provided in the second direction Y. The index module 10 has a load port 12 and an index frame 14. The load port 12 is located on an opposite side of the treating module 20 based on the index frame 14. The container C in which the substrates W are stored is placed on the load port 12. The load port 12 may be provided in a plurality, and the plurality of load ports 12 may be disposed along the second direction Y.

As the container C, a sealed container such as a front open integrated pod (FOUP) may be used. The container C may be placed on the load port 12 by a transfer means (not shown) such as an overhead transfer, an overhead conveyor, or an automatic guided vehicle or by an operator.

An index robot 120 is provided at the index frame 14. A guide rail 124 with its lengthwise direction in the second direction Y may be provided within the index frame 14, and the index robot 120 may be provided to be movable along the guide rail 124. The index robot 120 may include a hand 122 on which the substrate W is placed, and the hand 122 may be forwardly and backwardly movable, rotatable with the third direction Z as an axis, and movable along the third direction Z. The hand 122 are provided in a plurality to be spaced apart in an up/down direction, and the hands 122 may be forwardly and backwardly movable independently from each other.

A controller 30 may control the substrate treating apparatus. The controller may comprise a process controller consisting of a microprocessor (computer) that executes a control of the substrate treating apparatus, a user interface such as a keyboard via which an operator inputs commands to manage the substrate treating apparatus, and a display showing the operation situation of the substrate treating apparatus, and a memory unit storing a treating recipe, i.e., a control program to execute treating processes of the substrate treating apparatus by controlling the process controller or a program to execute components of the substrate treating apparatus according to data and treating conditions. In addition, the user interface and the memory unit may be connected to the process controller. The treating recipe may be stored in a storage medium of the storage unit, and the storage medium may be a hard disk, a portable disk, such as a CD-ROM or a DVD, or a semiconductor memory, such as a flash memory.

The controller 30 may control the substrate treating apparatus to perform a substrate treating method described below. For example, the controller 30 may control the fluid supply unit 530, the first exhaust unit 550, and the second exhaust unit 560 to perform the substrate treating method described below.

The treating module 20 includes a buffer unit 200, a transfer chamber 300, a liquid treating chamber 400, and a drying chamber 500. The buffer unit 200 provides a space in which the substrate W taken into the treating module 20 and the substrate W taken out from the treating module 20 temporarily remain. The liquid treating chamber 400 performs a liquid treatment process of liquid treating the substrate W by supplying a liquid onto the substrate W. The drying chamber 500 performs a drying process of removing a liquid remaining on the substrate W. The transfer chamber 300 transfers the substrate W between the buffer unit 200, the liquid treating chamber 400, and the drying chamber 500.

A lengthwise direction of the transfer chamber 300 may be provided in the first direction X. The buffer unit 200 may be disposed between the index module 10 and the transfer chamber 300. The liquid treating chamber 400 and the drying chamber 500 may be disposed on a side of the transfer chamber 300. The liquid treating chamber 400 and the transfer chamber 300 may be disposed in the second direction Y. The drying chamber 500 and the transfer chamber 300 may be disposed in the second direction Y. The buffer unit 200 may be located at an end of the transfer chamber 300.

According to an embodiment, the liquid treating chambers 400 may be disposed at both sides of the transfer chamber 300, the drying chambers 500 may be disposed at both sides of the transfer chamber 300, and the liquid treating chambers 400 may be disposed closer to the buffer unit 200 than the drying chambers 500. At a side of the transfer chamber 300, the liquid treating chambers 400 may be respectively provided in an arrangement of A×B (A and B are respectively a natural number greater than 1 or 1) along the first direction X and the third direction Z. In addition, at a side of the transfer chamber 300, the drying chambers 500 may be respectively provided in an arrangement of C×D (C and D are respectively a natural number greater than 1 or 1) along the first direction X and the third direction Z. Unlike described above, only the liquid treating chambers 400 can be provided on a side of the transfer chamber 300, and only the drying chambers 500 can be provided on the other side.

The transfer chamber 300 has a transfer robot 320. A guide rail 324 with its lengthwise direction in the first direction X may be provided within the transfer chamber 300, and the transfer robot 320 may be provided to be movable along the guide rail 324. The transfer robot 320 may include a hand 322 on which the substrate W is placed, and the hand 322 may be provided to be forwardly and backwardly movable, rotatable with the third direction Z as an axis, and movable along the third direction Z. The hand 322 is provided in a plurality to be spaced apart in the up/down direction, and the hands 322 may be forwardly and backwardly movable independently from each other.

The buffer unit 200 includes a plurality of buffers 220 on which the substrate W is placed. The buffers 220 may be disposed to be spaced apart from each other along the third direction Z. A front face and a rear face of the buffer unit 200 are opened. The front face is a surface facing the index module 10, and the rear face is a surface facing the transfer chamber 300. The index robot 120 may access the buffer unit 200 through the front face, and the transfer robot 320 may access the buffer unit 200 through the rear face.

Figure 2:
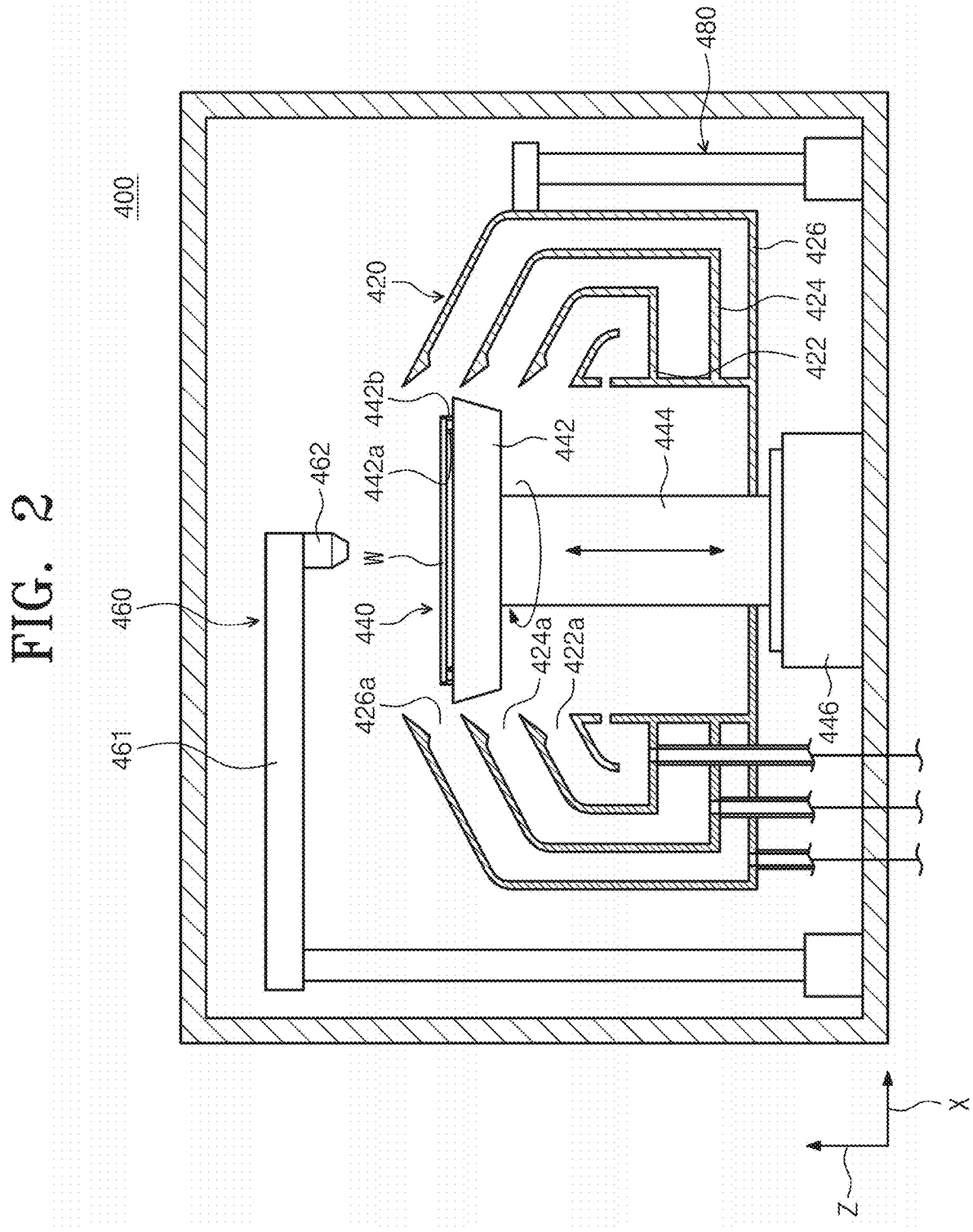
FIG. 2 schematically illustrates an embodiment of a liquid treating chamber of FIG. 1.

FIG. 2 schematically illustrates an embodiment of the liquid treating chamber of FIG. 1. Referring to FIG. 2, the liquid treating chamber 400 has a housing 410, a cup 420, a support unit 440, a liquid supply unit 460, and a lifting/lowering unit 480.

The housing 410 may have an inner space in which the substrate W is treated. The housing 410 may have a substantially hexahedral shape. For example, the housing 410 may have a rectangular parallelepiped shape. In addition, an opening (not shown) through which the substrate W is taken in or taken out may be formed at the housing 410. In addition, a door (not shown) for selectively opening and closing the opening may be installed at the housing 410.

The cup 420 may have a cylindrical shape with an open top. The cup 420 may have a treating space, and the substrate W may be liquid-treated within the treating space. The support unit 440 supports the substrate W in the treating space. The liquid supply unit 460 supplies the treating liquid onto the substrate W supported by the support unit 440. The treating liquid may be provided in a plurality of types and may be sequentially supplied onto the substrate W. The lifting/lowering unit 480 adjusts a relative height between the cup 420 and the support unit 440.

According to an embodiment, the cup 420 has a plurality of recollecting containers 422, 424, and 426. Each of the recollecting containers 422, 424, and 426 has a recollecting space for recollecting a liquid used for a substrate treatment. Each of the recollecting containers 422, 424, and 426 is provided in a ring shape surrounding the support unit 440. During the liquid treatment process, the treating liquid scattered by a rotation of the substrate W is introduced into the recollecting space through an inlet 422a, 424a, and 426a of the respective recollecting container 422, 424, and 426. According to an embodiment, the cup 420 has a first recollecting container 422, a second recollecting container 424, and a third recollecting container 426. The first recollecting container 422 is disposed to surround the support unit 440, the second recollecting container 424 is disposed to surround the first recollecting container 422, and the third recollecting container 426 is disposed to surround the second recollecting container 424. The second inlet 424a introducing a liquid into the second recollecting container 424 may be positioned above the first inlet 422a introducing a liquid into the first recollecting container 422, and the third inlet 426a introducing a liquid into the third recollecting container 426 may be positioned above the second inlet 424a.

The support unit 440 has a support plate 442 and a drive shaft 444. A top surface of the support plate 442 is generally provided in a circular shape and may have a diameter larger than a diameter of the substrate W. A support pin 442a supporting a bottom surface of the substrate W is provided at a center of the support plate 442, and the support pin 442a is provided such that a top end thereof protrudes from the support plate 442 so that the substrate W is spaced apart from the support plate 442 by a predetermined distance. A chuck pin 442b is provided at an edge of the support plate 442. The chuck pin 442b is provided to upwardly protrude from the support plate 442, and supports a side of the substrate W so that the substrate W is not separated from the support unit 440 when the substrate W is rotated. The drive shaft 444 is driven by the driver 446, is connected to a center of the bottom surface of the substrate W, and rotates the support plate 442 based on a center axis thereof.

According to an embodiment, the liquid supply unit 460 may include a nozzle 462. The nozzle 462 may supply the treating liquid to the substrate W. The treating liquid may be a chemical, a rinsing liquid, or an organic solvent. The chemical may be a chemical with strong acid or strong base properties. Also, the rinsing liquid can be a deionized water. In addition, the organic solvent may be an isopropyl alcohol (IPA). In addition, the treating liquid supplied by the liquid supply unit 460 may be a solvent. For example, the treating liquid supplied by the liquid supply unit 460 may be a developing liquid.

In addition, the liquid supply unit 460 may include a plurality of nozzles 462, and each of the nozzles 462 may supply different types of a treating liquid. For example, one of the nozzles 462 may supply the chemical, another one of the nozzles 462 may supply the rinsing liquid, and another one of the nozzles 462 may supply the organic solvent. In addition, the controller 30 may control the liquid supply unit 460 to supply the organic solvent from another one of the nozzles 462 after supplying the rinsing liquid to the substrate W from yet another one of the nozzles 462. Accordingly, the rinsing liquid supplied onto the substrate W may be replaced with an organic solvent having a small surface tension. In addition, a developing liquid may be supplied from any one of the nozzles 462.

The lifting/lowering unit 480 moves the cup 420 in the up/down direction. A relative height between the cup 420 and the substrate W is changed by the up/down movement of the cup 420. Accordingly, the recollecting containers 422, 424, and 426 for recollecting the treating liquid are changed according to the type of liquid supplied to the substrate W, so that the liquids can be separately recovered. As described above, the cup 420 is fixedly installed, and the lifting/lowering unit 480 may move the support unit 440 in the up/down direction.

Figure 3:
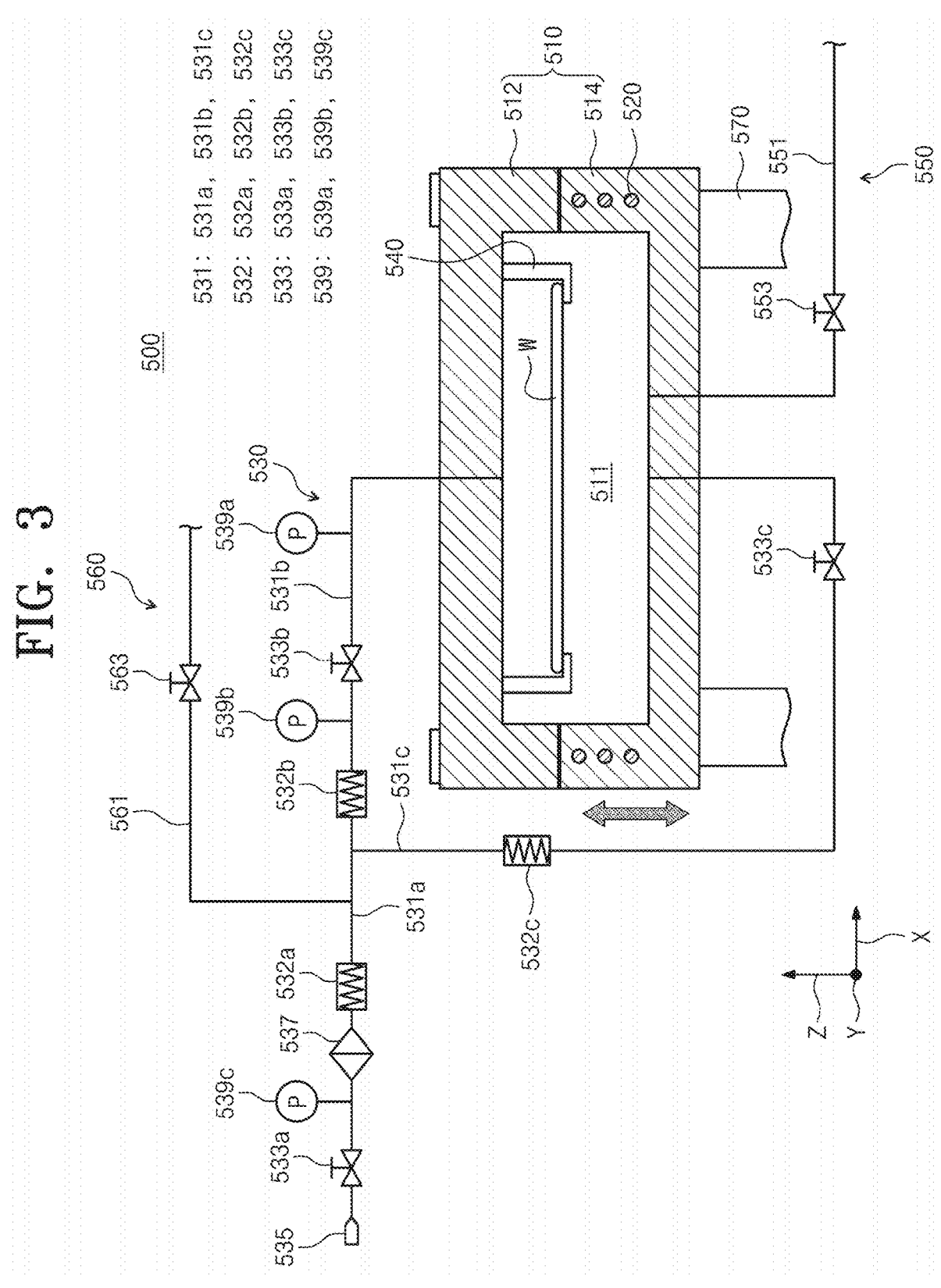
FIG. 3 schematically illustrates an embodiment of a drying chamber of FIG. 1.

FIG. 3 is a view schematically illustrating an embodiment of the drying chamber of FIG. 1. Referring to FIG. 3, the drying chamber 500 in accordance with an embodiment of the inventive concept may remove a treating liquid remaining on the substrate W by using a treating fluid in a supercritical state. The treating liquid to be removed may be any one of the above-described such as the chemical, the rinsing liquid, the organic solvent, and the developing liquid. In addition, the treating fluid may include a carbon dioxide ($CO_2$). For example, the drying chamber 500 may remove the developing liquid remaining on the substrate W from the substrate W by using the carbon dioxide ($CO_2$) in a supercritical state.

The drying chamber 500 may include a body 510, a heating member 520, a fluid supply unit 530, a support member 540, a first exhaust unit 550, a second exhaust unit 560, and a lifting/lowering member 570.

The body 510 may have an inner space 511 in which the substrate W is treated. The body 510 may provide the inner space 511 in which the substrate W is treated. The body 510 may provide an inner space 511 in which the substrate W is dried by the treating fluid in the supercritical state. The body 510 may also be referred to as the chamber.

The body 510 may include a top body 512 and a bottom body 514. The top body 512 and the bottom body 514 combine with each other to form the inner space 511. One of the top body 512 and the bottom body 514 may be coupled to the lifting/lowering member 570 to move in the up/down direction. For example, the bottom body 514 may be coupled to the lifting/lowering member 570 and may be moved in the up/down direction by the lifting/lowering member 570. Accordingly, the inner space 511 of the body 510 may be selectively sealed. In the above-described example, the bottom body 514 is coupled to the lifting/lowering member 570 to move in the up/down direction, but is not limited thereto. For example, the top body 512 may be coupled to the lifting/lowering member 570 to move in the up/down direction. In addition, the top body 512 may also be referred to as a first body. In addition, the bottom body 514 may also be referred to as a second body.

The heating member 520 may heat the treating fluid supplied to the inner space 511. The heating member 520 may increase a temperature of the inner space 511 of the body 510. As the heating member 520 increases the temperature of the inner space 511, the treating fluid supplied to the inner space 511 may be converted into a supercritical state or maintained in a supercritical state.

In addition, the heating member 520 may be buried within the body 510. For example, the heating member 520 may be buried within any one of the top body 512 and the bottom body 514. For example, the heating member 520 may be provided within the bottom body 514. However, the inventive concept is not limited thereto, and the heating member 520 may be provided at various locations capable of increasing the temperature of the inner space 511. In addition, the heating member 520 may be a heater. However, this invention is not limited to it, and the heating member 520 can be variously modified as a known device capable of increasing the temperature of the inner space 511.

The fluid supply unit 530 may supply the treating fluid to the inner space 511. The treating fluid supplied by the fluid supply unit 530 may include a carbon dioxide. The treating fluid supplied by the fluid supply unit 530 may be supplied to the treating space 511 in a supercritical state, or may be converted into a supercritical state in the treating space 511. The fluid supply unit 530 may include a supply line 531, a heater 532, a valve 533, a fluid supply source 535, a filter 537, and a pressure sensor 539.

The supply line 531 may supply the treating fluid to the inner space 511. The supply line 531 may include a main supply line 531*a*, a top supply line 531*b* (a first supply line) and a bottom supply line 531*c* (a second supply line). The main supply line 531*a* may be connected to a fluid supply source. The top supply line 531*b* may branch from the main supply line 531*a* and connect to the top body 512. Accordingly, the top supply line 531*b* may supply the treating fluid to a top region of the inner space 511. The bottom supply line 531*c* may branch from the main supply line 531*a* and connect to the bottom body 514. Accordingly, the bottom supply line 531*c* may supply the treating fluid to a bottom region of the inner space 511.

The heater 532 may be installed at the supply line 531. The heater 532 may include a main heater 532*a* (which may be referred to as a first heater), a top heater 532*b* (which may be referred to as a second heater), and a bottom heater 532*c* (which may be referred to as a third heater). The main heater 532*a* may be installed at the main supply line 531*a*. The top heater 532*b* may be installed at the top supply line 531*b*. The bottom heater 532*c* may be installed at the bottom supply line 531*c*. The heater 532 may heat the supply line 531 to adjust a temperature of the treating fluid flowing (or remaining) in the supply line 531.

The main heater 532*a* may be installed downstream of the main valve 533*a* to be described later. The main heater 532*a* may be installed upstream of the branch point from which the aforementioned top supply line 531*b* and the bottom supply line 531*c* branch.

The top heater 532*b* may be installed downstream of the main valve 533*a* to be described later. The top heater 532*b* may be installed downstream from the branch point from which the aforementioned top supply line 531*b* and the bottom supply line 531*c* branch. In addition, the top heater 532*b* may be installed upstream of the top valve 533*b* to be described later.

The bottom heater 532*c* may be installed downstream of the main valve 533*a* to be described later. The bottom heater 532*c* may be installed downstream from the branch point from which the aforementioned top supply line 531*b* and the bottom supply line 531*c* branch. In addition, the bottom heater 532*c* may be installed upstream of the bottom valve 533*c* to be described later.

In addition, the main heater 532*a*, the top heater 532*b*, and the bottom heater 532*c* may always heat the supply line 531 during a drying step S30 and a standby step S40 to be described later. Alternatively, the main heater 532*a*, the top heater 532*b*, and the bottom heater 532*c* may receive a control signal from the controller 30 to heat the supply line 531 for a predetermined period.

The valve 533 may be installed at the supply line 531. The valve 533 may be a flow control valve or an opening/closing valve. Whether to supply the treating fluid to the inner space 511 may be determined by opening and closing the valve 533. The valve 533 may include a main valve 533*a* installed at the main supply line 531*a*, a top valve 533*b* (which may be referred to as a first valve) installed at the top supply line 531*b*, and a bottom valve 533*c* (which may be referred to as a second valve) installed at the bottom supply line 531*c*.

The fluid supply source 535 may store and/or supply treating fluid. The fluid supply source 535 may be a reservoir. The fluid supply source 535 may transfer the treating fluid to the supply line 531. The above-described main valve 533*a* may be installed between a fluid supply source 535 to be described later and the point from which the aforementioned top supply line 531*b* and the bottom supply line 531*c* branch.

The filter 537 may filter the treating fluid transferred from the fluid supply source 535 to the inner space 511. For example, the filter 537 may filter impurities that may be included in the treating fluid transferred to the inner space 511. The filter 537 may be installed at the main supply line 531*a*. The filter 537 may be installed upstream from the point from which the aforementioned top supply line 531*b* and the bottom supply line 531*c* branch. The filter 537 may be installed upstream from a point where a second decompression line 561 to be described later is connected to the main supply line 531*a*. The filter 537 may be installed downstream from the aforementioned main valve 533*a*. The filter 537 may be installed downstream from the third pressure sensor 539*c* to be described later.

The pressure sensor 539 may measure the pressure of the inner space 511 and/or the supply line 531. The pressure data measured by the pressure sensor 539 may be transmitted to the controller 30. The pressure sensor 539 may be installed at the supply line 531. The pressure sensor 539 may include a first pressure sensor 539*a*, a second pressure sensor 539*b*, and a third pressure sensor 539*c*. The first pressure sensor 539*a* may be installed downstream from the second pressure sensor 539*b*, and the second pressure sensor 539*b* may be installed downstream from the third pressure sensor 539*c*.

The first pressure sensor 539*a* may be installed at the top supply line 531*b*, but may be installed downstream from the top valve 533*b*. Accordingly, a pressure measured by the first pressure sensor 539*a* may be the same as a pressure of the inner space 511. That is, the pressure measured by the first pressure sensor 539*a* may be the pressure of the inner space 511 described below.

The second pressure sensor 539*b* may be installed at the top supply line 531*b*, but may be installed upstream from the top valve 533*b*. Accordingly, the second pressure sensor 539*b* may measure a pressure generated when the treating fluid supplied from the fluid supply source 535 flows to the supply line 531. That is, the pressure measured by the second pressure sensor 539*b* may be a pressure of the supply line 531 described below.

The third pressure sensor 539*c* may be installed at the main supply line 531*a*, and may be installed between the filter 537 and the main valve 533*a*. Accordingly, the third pressure sensor 539*c* may measure a pressure generated when the treating fluid supplied from the fluid supply source 535 flows into the supply line 531. That is, the pressure measured by the third pressure sensor 539*c* may be the pressure of the supply line 531 described below, similar to the pressure measured by the above-described second pressure sensor 539*b*.

The support member 540 may support the substrate W in the inner space 511. The support member 540 may be configured to support an edge region of the substrate W at the inner space 511. For example, the support member 540 may be configured to support a bottom surface of an edge region of the substrate W at the inner space 511.

The first exhaust unit 550 may decompress the inner space 511. The first exhaust unit 550 may decompress the inner space 511 by discharging the treating fluid supplied to the inner space 511 to the outside. The first exhaust unit 550 may include a first decompression line 551 communicating with the inner space 511 and a first decompression valve 553 installed at the first decompression line 551.

The second exhaust unit 560 may decompress the supply line 531. The second exhaust unit 560 may decompress the inner space 511 by discharging the treating fluid supplied to the supply line 531 to the outside. For example, the second exhaust unit 560 may include a second decompression line 561 connected to the main supply line 531*a* at the upstream of the point from which the top supply line 531*b* and the bottom supply line 531*c* branches, and a second decompression valve 563 installed at the second decompression line 561.

Hereinafter, a substrate treating method according to an embodiment of the inventive concept will be described. The substrate treating method described below may be performed by the substrate treating apparatus. As described above, the controller 30 may control the substrate treating apparatus so that the substrate treating apparatus may perform the substrate treating method described below. In addition, the controller 30 may generate a control signal for performing a control method for the substrate treating apparatus described below. Further, the controller 30 may control at least one of the above-described: the fluid supply unit 530, the first exhaust unit 550, and the second exhaust unit 560 described below, or combinations thereof.

Figure 4:
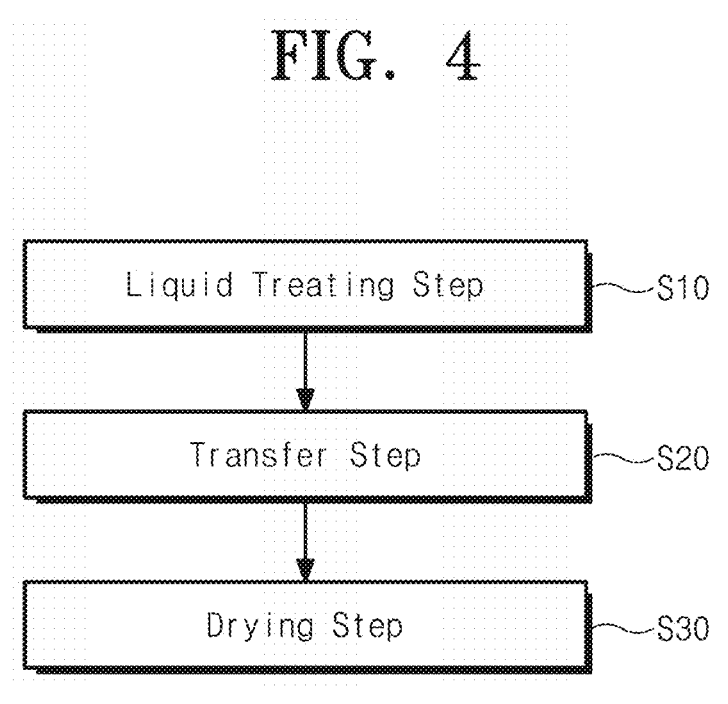

FIG. 4 is a flowchart illustrating the substrate treating method according to an embodiment of the inventive concept. Referring to FIG. 4, the substrate treating method in accordance with an embodiment of the inventive concept may include a liquid treating step S10, a transfer step S20, and a drying step S30.

The liquid treating step S10 is a step of liquid treating the substrate W by supplying the treating liquid to the substrate W. The liquid treating step S10 may be performed at the liquid treating chamber 400. For example, in the liquid treating step S10, the substrate W may be liquid-treated by supplying the treating liquid L to a rotating substrate W (see FIG. 5). The treating liquid L supplied at the liquid treating step S10 may be at least one of the above-described: the chemical, the rinsing liquid, the organic solvent, and the developing liquid. For example, in the liquid treating step S10, the substrate W may be rinse-treated by supplying the rinsing liquid to the rotating substrate W. Thereafter, the organic solvent may be supplied to the rotating substrate W to replace a rinsing liquid remaining on the substrate W with the organic solvent. In addition, for example, in the liquid treating step S10, the substrate W may be developed by supplying a developing liquid to the rotating substrate W.

The transfer step S20 is a step of transferring the substrate W. The transfer step S20 may be a step of transferring the liquid-treated substrate W to the drying chamber 500. For example, at the transfer step S20, the transfer robot 320 may transfer the substrate W from the liquid treating chamber

400 to the inner space 511 of the drying chamber 500. A treating liquid L may remain on the substrate W to be transferred in the transfer step S20. For example, an organic solvent may remain on the substrate W. For example, a developing liquid may remain on the substrate W. That is, the substrate W may be transferred to the drying chamber 500 in a state in which the top surface thereof is wetted with the developing liquid or the organic solvent. As described above, the substrate W is transferred to the drying chamber 500 in a wetted state, thereby minimizing an occurrence of a leaning phenomenon in the pattern formed on the substrate W.

The drying step S30 is a step of drying the substrate W using the treating fluid in the supercritical state after the substrate W is introduced into the inner space 511. The drying step S30 may be referred to as a dry treating step. The drying step S30 may be performed at the drying chamber 500. In the drying step S30, the substrate W may be dried by supplying the treating fluid to the inner space 511 of the body 510, thereby to the substrate W. For example, in the drying step S30, the treating fluid in the supercritical state may be transferred to the substrate W in the inner space 511. The treating fluid in the supercritical state transferred to the substrate W is mixed with a treating liquid L remaining on the top surface of the substrate W. In addition, as the treating fluid mixed with the treating liquid L is discharged from the inner space 511, the treating liquid L may be removed from the substrate W.

Figure 5:
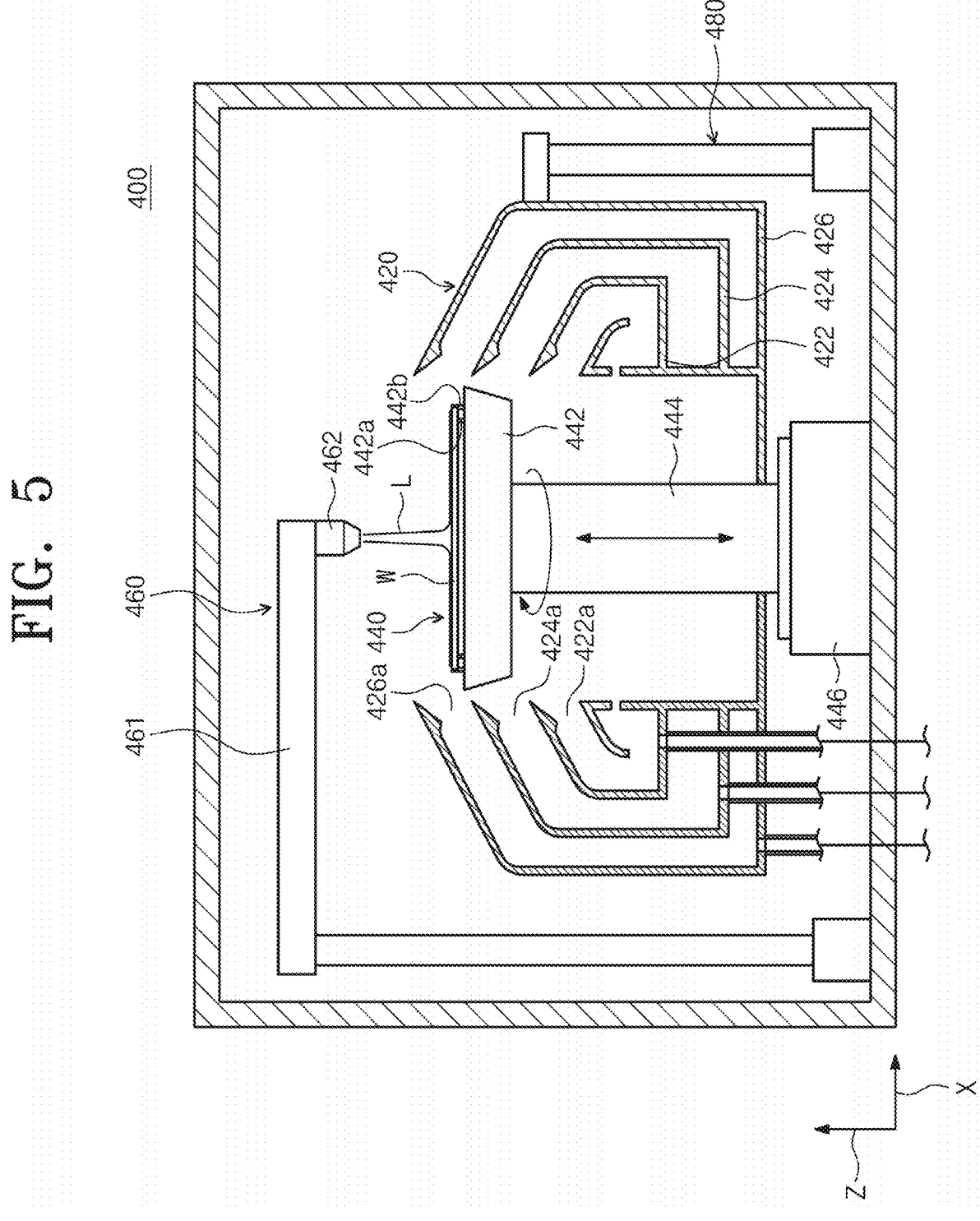
FIG. 5 illustrates a state of the liquid treating chamber performing a liquid treating step of FIG. 4.
Figure 6:
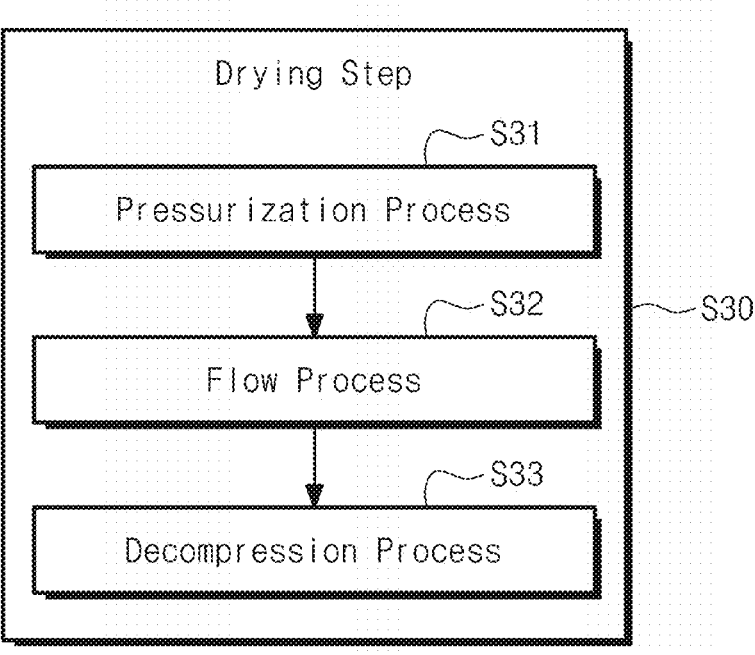
FIG. 6 is a detailed flowchart of a drying step of FIG. 5.

Hereinafter, the drying step S30 according to an embodiment of the inventive concept will be described in more detail. FIG. 6 is a detailed flowchart of the drying step of FIG. 5, and FIG. 7 is a graph illustrating a pressure change in the inner space of the chamber while the substrate treating apparatus performs a drying step and a standby step after the drying step is performed.

Figure 7:
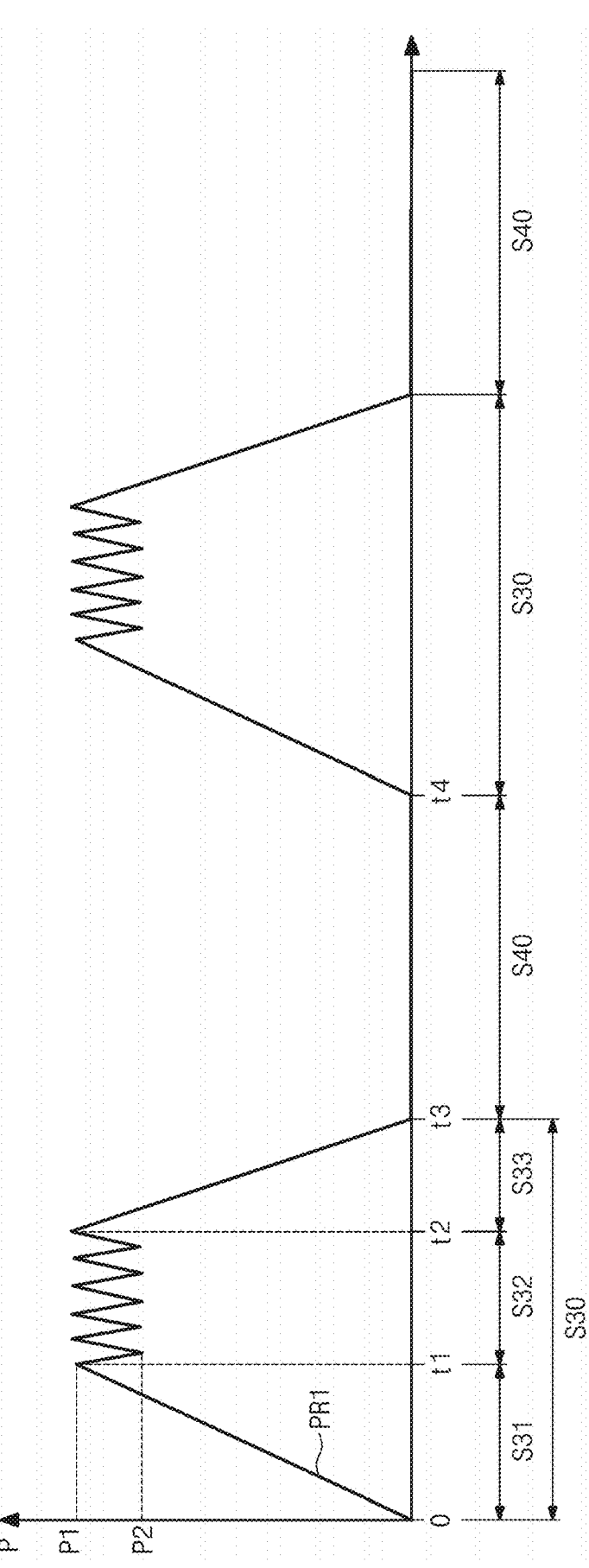
FIG. 7 is a graph illustrating a pressure change in an inner space of a chamber while the substrate treating apparatus performs the drying step, and a standby step after the drying step is performed.

FIG. 7 illustrates a first pressure profile PR1 with respect to the pressure change of the inner space 511. The first pressure profile PR1 may be pressure data measured by the first pressure sensor 539*a*. The drying step S30 and the standby step S40 may be sequentially and repeatedly performed. In the standby step S40, the pressure of the inner space 511 may be maintained at a normal pressure.

Referring to FIG. 6 and FIG. 7, the drying step S30 in accordance with an embodiment of the inventive concept may include a pressurization process S31, a flow process S32, and a decompression process S33. The pressurization process S31, the flow process S32, and the decompression process S33 may be sequentially performed. The pressurization process S31 may be performed at 0 to t1 of FIG. 7, the flow process S32 may be performed at t1 to t2 of FIG. 7, and the decompression process S33 may be performed at t2 to t3 of FIG. 7. In short, the drying step S30 may be performed during 0 to t3. In addition, the standby step S40 may be performed in t3 to t4 of FIG. 7.

The pressurization process S31 may be a step of increasing the pressure of the inner space 511 to a predetermined pressure, for example, a first pressure P1. The pressurization process S31 may be performed after the substrate W is introduced into the inner space 511. In the pressurization process S31, the treating fluid may be supplied to the inner space 511 to increase the pressure of the inner space 511 to the first pressure P1.

The flow process S32 may be performed after the pressurization process S31. In the flow process S32, the treating fluid may be supplied to the inner space 511 or the treating fluid may be discharged from the inner space 511. For example, while the treating fluid is supplied to the inner space 511 in the flow process S32, the treating fluid may not be discharged from the inner space 511. Also, while the treating fluid is discharged from the inner space 511 in the flow step S32, the treating fluid may not be supplied to the inner space 511. That is, in the flow process S32, the pressure of the inner space 511 may be changed by a partial pressure difference. In the flow process S32, the pressure of the inner space 511 may be repeatedly pulsed between the first pressure P1 and the second pressure P2. The second pressure P2 may be lower than the first pressure P1. The first pressure P1 may be about 150 Bar. The second pressure P2 may be about 120 Bar. In the flow process S32, the treating fluid supplied to the inner space 511 flows, and thus the treating liquid L remaining on the substrate W may be more effectively removed from the substrate W.

The decompression process S33 may be performed after the flow process S32. In the decompression process S33, the pressure of the inner space 511 of the body 510 may be lowered. For example, in the decompression process S33, the pressure of the inner space 511 of the body 510 may be reduced to a normal pressure. For example, when the decompression process S33 is performed, the pressure of the inner space 511 may be decompressed from the first pressure P1 or the second pressure P2 to the normal pressure.

Figure 8:
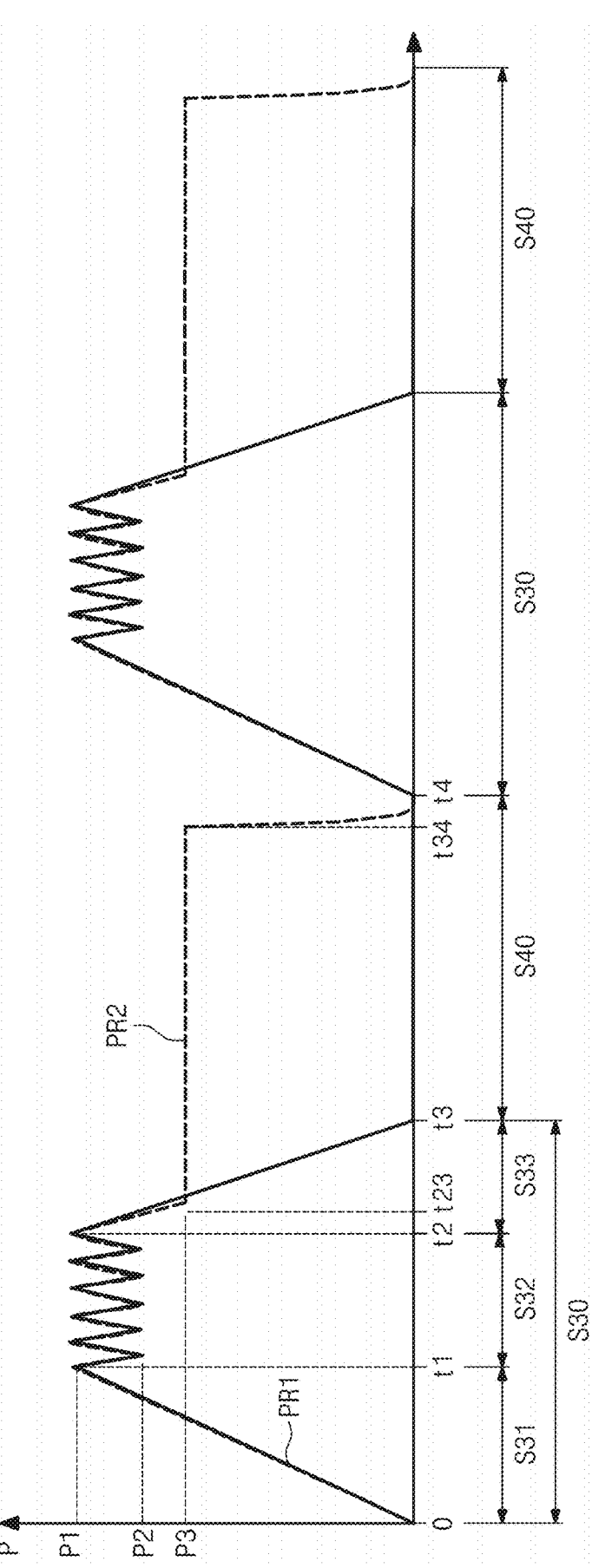
FIG. 8 is a graph illustrating the pressure change in the inner space of a chamber and a pressure change of a supply line while the substrate treating apparatus performs the drying step and the standby step after the drying step is performed.

FIG. 8 is a graph illustrating the pressure change in the inner space of the chamber and the pressure change of a supply line while the substrate treating apparatus performs the drying step and the standby step after the drying step is performed. In FIG. 8, the first pressure profile PR1 for the pressure change of the inner space 511 and the second pressure profile PR2 for the pressure change of the supply line 531 are illustrated. The first pressure profile PR1 may be a pressure data measured by the first pressure sensor 539a. The second pressure profile PR2 may be a pressure data measured by the second pressure sensor 539b. In addition, the second pressure profile PR2 may be a pressure data measured by the third pressure sensor 539c.

Figure 9:
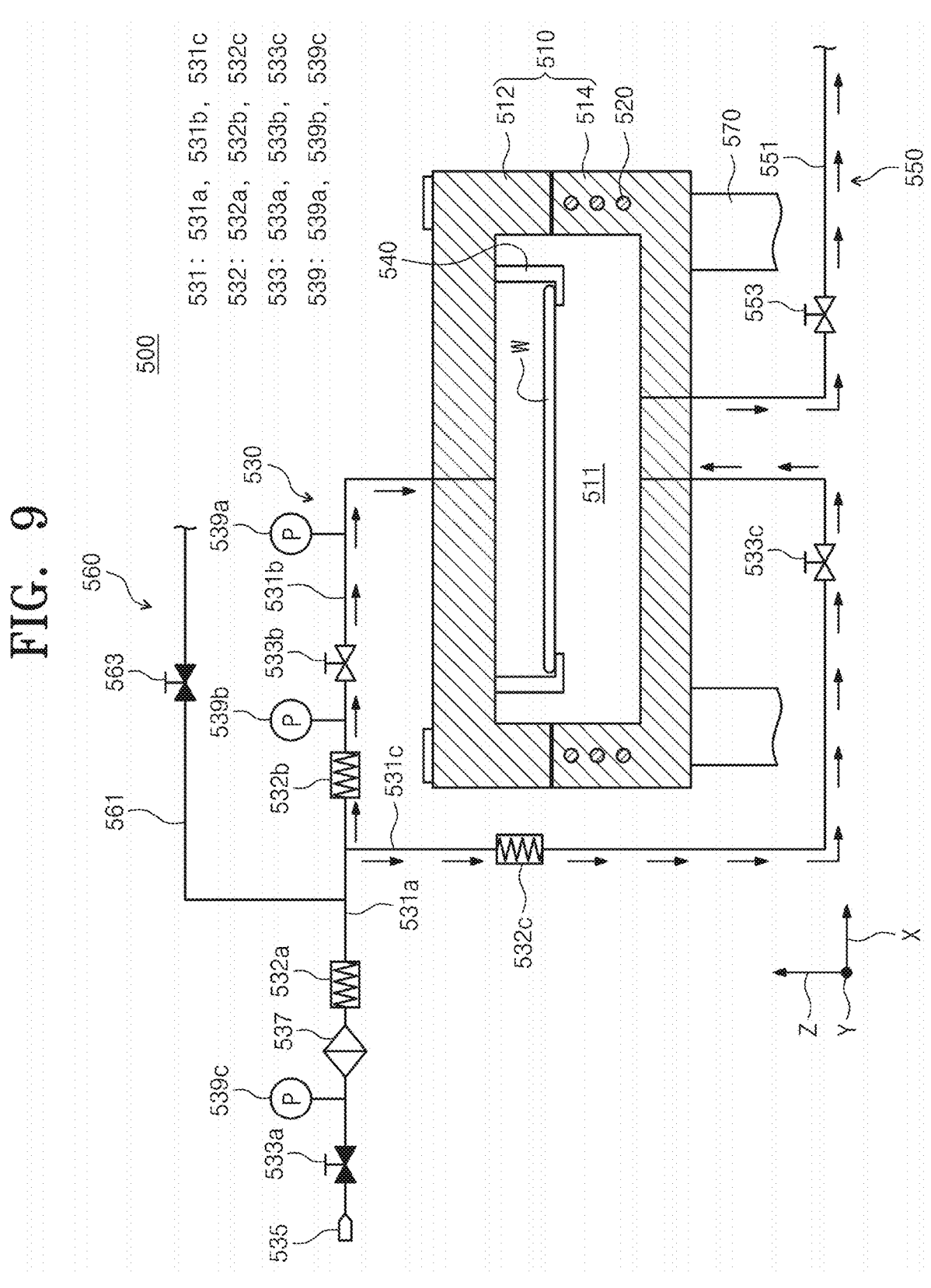
FIG. 9 illustrates a state in which the substrate treating apparatus is driven in t2 to t23 of FIG. 8.

Referring to FIG. 8, the second pressure profile PR2, which is a pressure profile with respect to the supply line 531, has a tendency generally similar to that of the first pressure profile PR1 with respect to the inner space 511 during 0 to t23. For example, in t2 to t23 which is a part the decompression process S33, the main valve 533a and the second decompression valve 563 may be closed, and the top valve 533b, the bottom valve 533c, and the first decompression valve 553 may be opened as illustrated in FIG. 9. Accordingly, the pressure of the inner space 511 and pressure of the supply line 531 may be lowered with the same or similar tendency.

Figure 10:
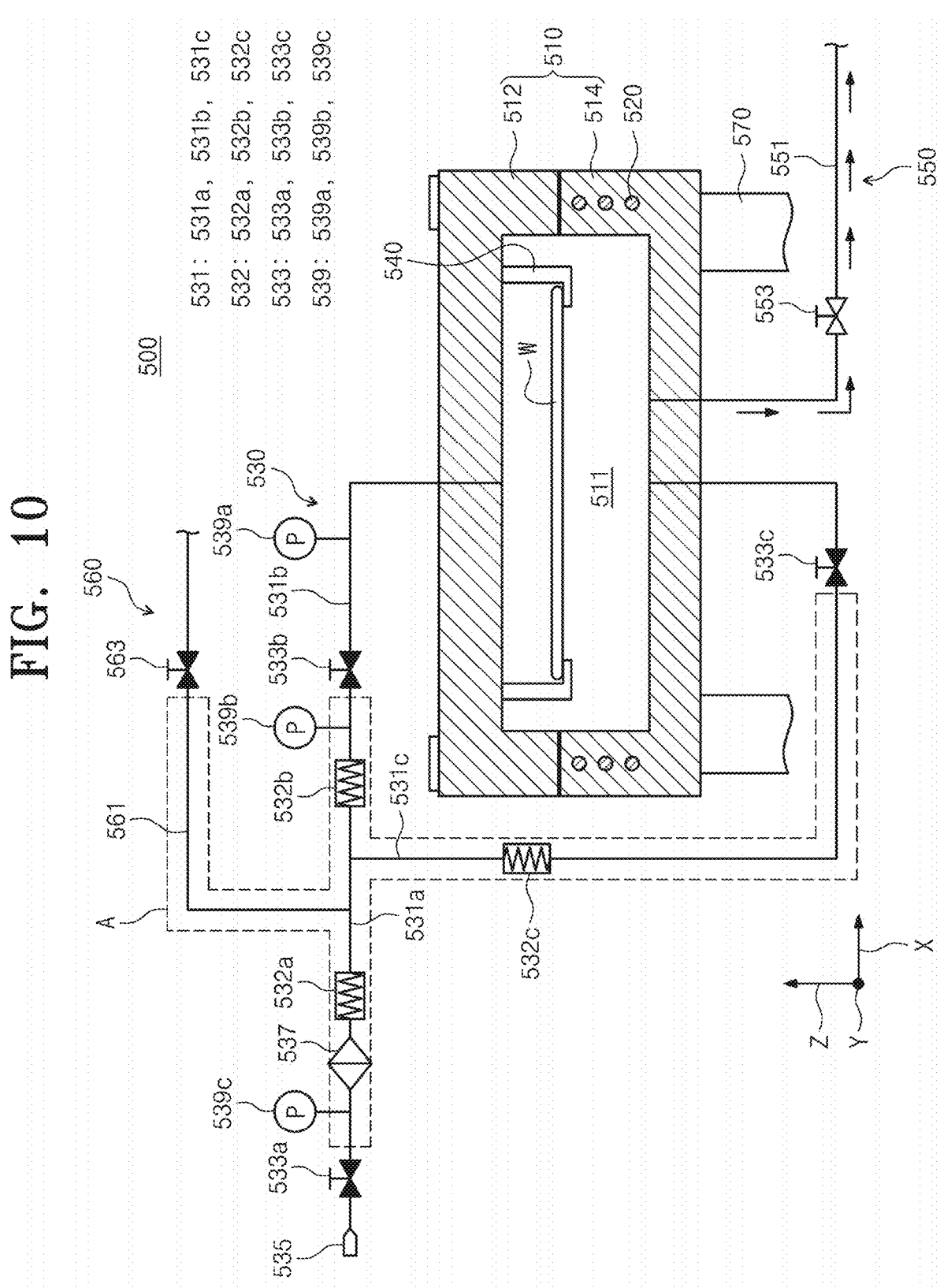
FIG. 10 illustrates a state in which the substrate treating apparatus is driven in t23 to t3 of FIG. 8.

In t23 to t3, as shown in FIG. 10, the main valve 533a, the top valve 533b, the bottom valve 533c, and the second decompression valve 563 may be closed, and the first decompression valve 553 may be opened. Accordingly, the pressure of the inner space 511 is lowered to a pressure close to the normal pressure (atmospheric pressure) or lowered to the normal pressure (atmospheric pressure), and the pressure of the supply line 531 may be maintained at a predetermined pressure, for example, a third pressure P3. The third pressure P3 may be a pressure higher than a critical pressure at which the treating fluid may maintain the supercritical state, for example, a pressure greater than or equal to the critical pressure. For example, the third pressure P3 may be about 100 bar. In addition, when the pressure of the inner space 511 is lowered to a pressure close to the normal pressure (atmospheric pressure) or lowered to the normal pressure (atmospheric pressure), the substrate W dried in the inner space 511 may be taken out.

Figure 11:
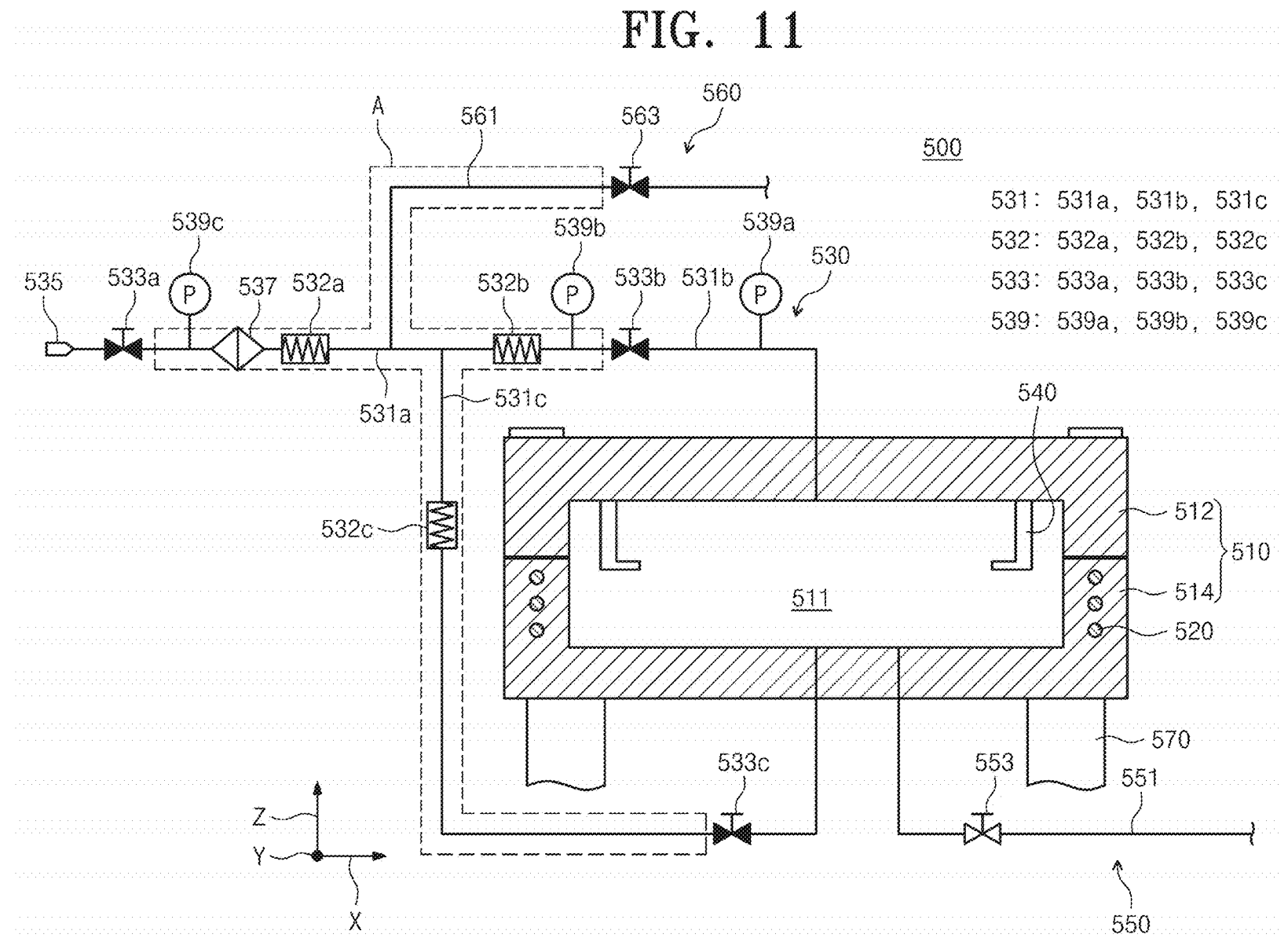

After a performing of the treating step S30 is completed, a standby step S40 for standing by for a new substrate W that has not been treated (not dried) to be brought into the inner space 511 is performed, i.e., keeping the new substrate W to be treated outside the inner space 511 before introducing the new substrate W into the inner space 511. The pressure of the supply line 531 may be kept constant at the third pressure P3 during at least a part of a time of t3 to t4, which is a time when the standby step S40 is performed (for example, t3 to t34), as shown in FIG. 11. In short, the treating fluid may remain in the supply line 531 for a predetermined time t3 to t34 after the time t3 at which the substrate W is taken out of the inner space.

Figure 12:
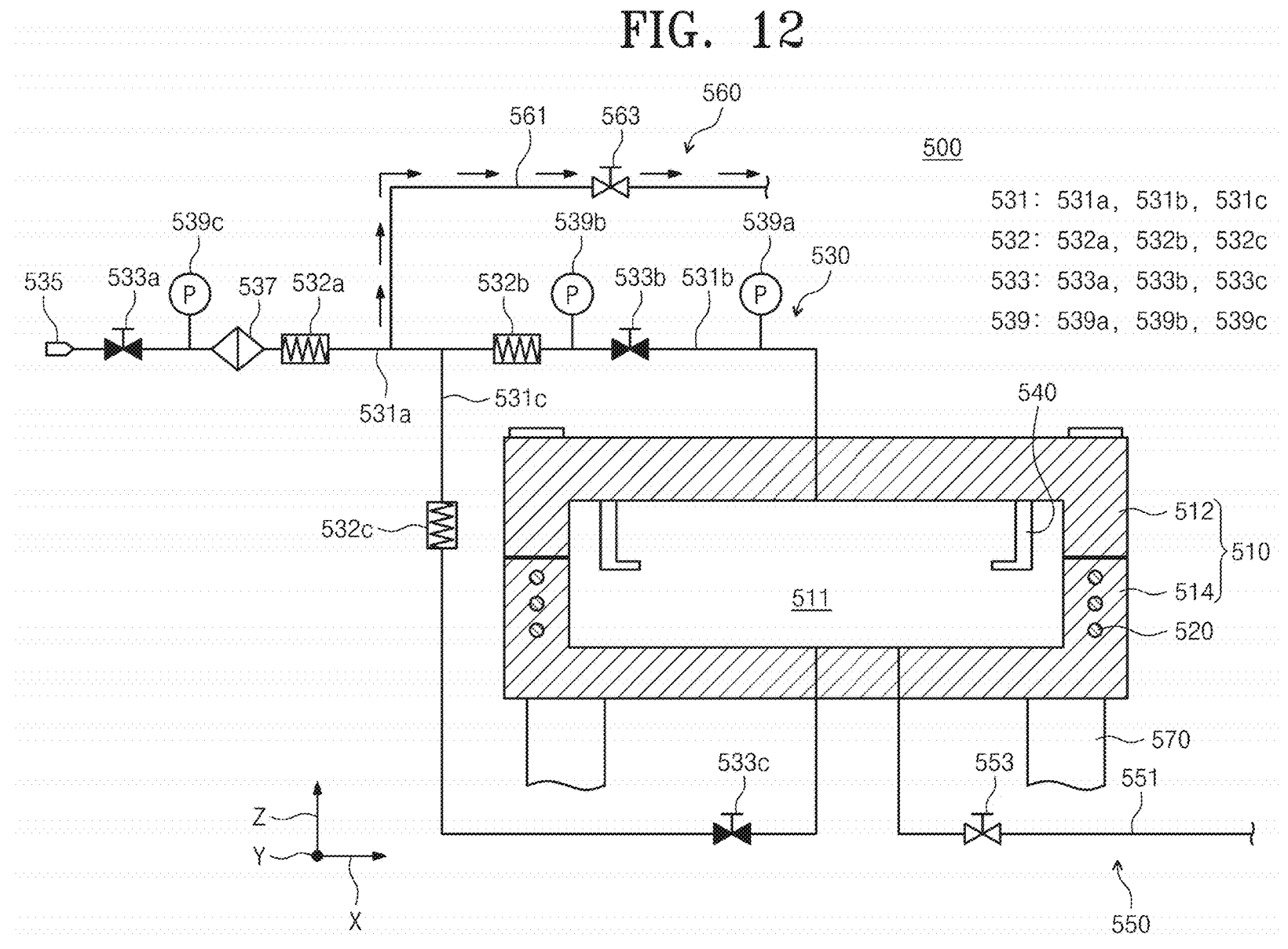

At t4, the standby step S40 is switched to the treating step S30. In short, in t4, the supercritical drying process is started again on an untreated substrate W taken into the inner space 511. As illustrated in FIG. 12, the second decompression valve 563 is opened at t34 which is earlier by a predetermined time than t4 from which the process enter into the standby step S40 from the treating step S30, so that the treating fluid remaining in the supply line 531 and the second decompression line 561 may be discharged to the outside. This is to dry the substrate W using the treating fluid newly supplied from the fluid supply source 535 at the treating step S30 to be performed later. Accordingly, the pressure of the supply line 531 may be lowered from the third pressure P3 to the normal pressure during t34 to t4.

In order to maintain a treating efficiency and a treating uniformity with respect to the substrate W, it is important to constantly maintain a condition of the substrate treating apparatus. For example, it is important to maintain a condition of the substrate treating apparatus provided in the drying chamber 500 to be similar to a condition of the substrate treating apparatus performing the drying step S30. When a time of the standby step S40 increases, it becomes difficult to appropriately maintain the condition of the substrate treating apparatus. In this case, an occurrence frequency of process defects with respect to the substrate W increases. Accordingly, when a time for performing the standby step S40 becomes longer than a predetermined time, the same operation as that of the drying step S30 is performed without introducing the substrate W into the inner space 511. In general, this is referred to as an automatic vessel clean (AVC) process. However, since this automatic vessel clean process is performed in the same manner as the drying treatment on the substrate W, a consumption of the treating fluid, which is a carbon dioxide, is great. In addition, since the substrate treating apparatus provided at the drying chamber 500 is driven in the same manner as the drying treatment for the substrate W, a replacement cycle of the components of the substrate treating apparatus is shortened.

Accordingly, in a control method of the substrate treating apparatus according to an embodiment of the inventive concept, the treating fluid remains in the supply line 531 in t23 to t34. The pressure of the supply line 531 may be maintained at the third pressure P3, which is a pressure greater than or equal to a critical pressure at which the treating fluid may maintain the supercritical state. For example, in t23 to t34, the main valve 533a, the top valve 533b, the bottom valve 533c, and the second decompression valve 563 may be closed to leave the treating fluid in a region A shown in FIG. 10 and FIG. 11. The heater 532 heats the supply line 531 in which the treating fluid remains and a condition is maintained at the third pressure P3. That is, according to an embodiment of the inventive concept, while the standby step S40 is being performed, the supply line 531 in a state in which the treating fluid is filled is continuously heated by the heater 532 until t34, just before the new drying step S30 is performed. Accordingly, the condition of the substrate treating apparatus can be maintained relatively constant, and the number of the automatic chamber cleaning process described above can be effectively reduced. Accordingly, it is possible to prevent an excessive consumption of the treating fluid, which is a carbon dioxide, and to shorten a replacement cycle of the components of the substrate treating apparatus. Also, since the condition of the substrate treating apparatus can be maintained relatively constant, a deviation of the drying treatment between the treated substrates W can be enhanced. In addition, when the treating fluid maintains the supercritical state, a reactivity of the treating fluid is relatively high. That is, when the treating fluid maintained in the supercritical state in the supply line 531 remains and is discharged by the second exhaust unit 560, impurities remaining in the supply line 531 may be effectively discharged. In short, it is possible to effectively clean the supply line 531.

Figure 13:
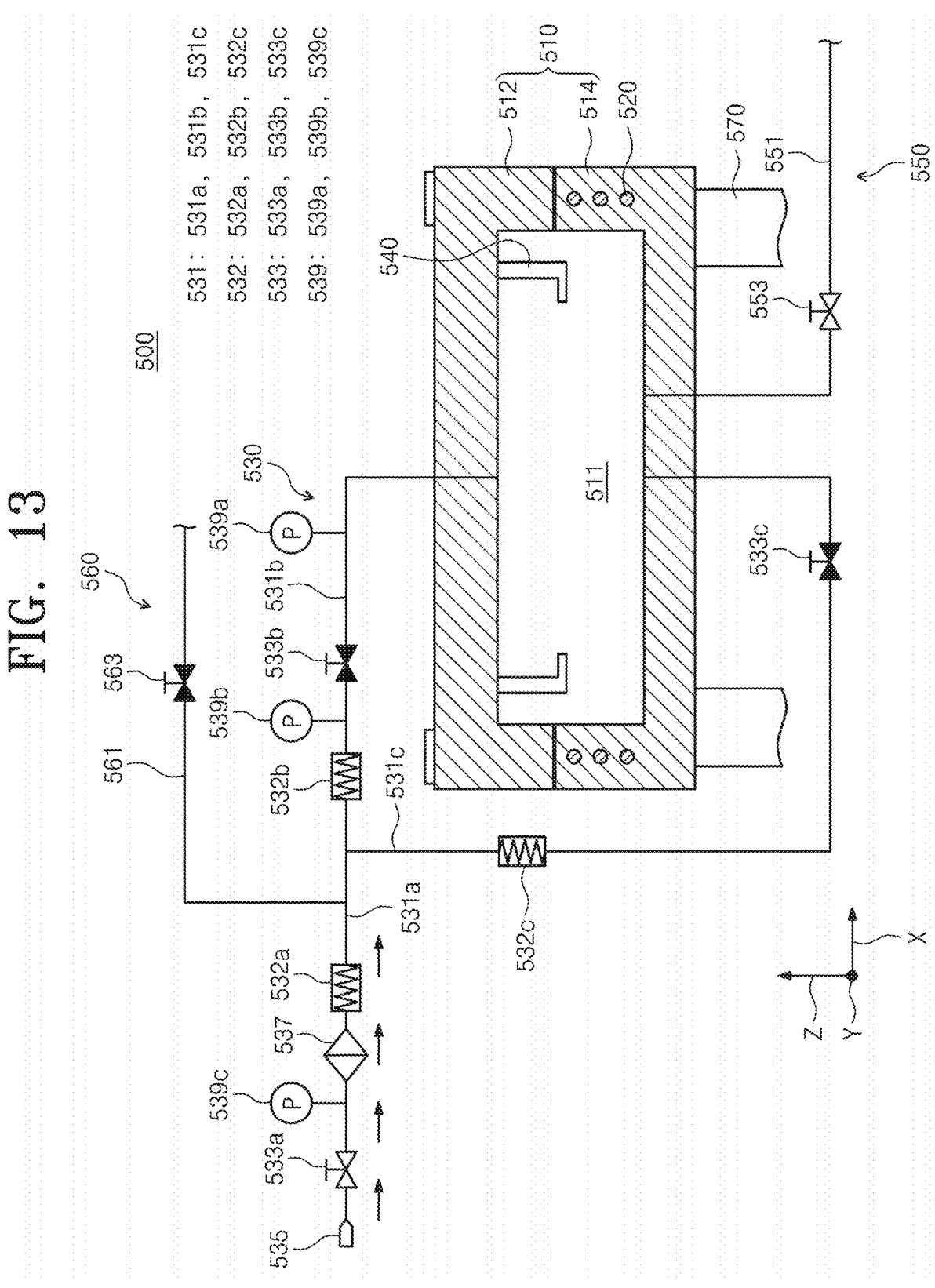
FIG. 13 illustrates a state in which the treating fluid is supplied to the supply line when a pressure within the supply line drops in t23 to t34 of FIG. 8.

In addition, the controller 30 may continuously receive a pressure data measured by the second pressure sensor 539b or the third pressure sensor 539c at t23 to t34. In some cases, a pressure value measured by the second pressure sensor 539b or the third pressure sensor 539c may be lower than a predetermined pressure. For example, when a slight leak occurs in the supply line 531, the pressure of the supply line 531 is lowered. In this case, it becomes difficult to maintain a constant state of the supply line 531. The controller 30 may generate a control signal for opening the main valve 533a as illustrated in FIG. 13 when the pressure of the supply line 531 is lowered as described above. When the main valve 533a is opened, the treating fluid may be supplied from the fluid supply source 535 to the supply line 531. Accordingly, the pressure of the supply line 531 may again reach a predetermined pressure (e.g., a third pressure P3). Accordingly, a condition of the supply line 531, which is a pipe, may be kept constant. In addition, when the pressure of the supply line 531 decreases, the controller 30 may generate a control signal for controlling an alarm member (not shown) so that the user may recognize a leak.

In the above-described example, it has been described that the third pressure P3 is lower than the first pressure P1 and the second pressure P2, but the inventive concept is not limited thereto. For example, the third pressure P3 may be about 120 Bar to 140 Bar.

In the above-described example, the treating fluid was explained as a carbon dioxide as an example, but is not limited thereto. For example, the treating fluid may be transformed into various fluids capable of performing the supercritical drying process.

Figure 14:
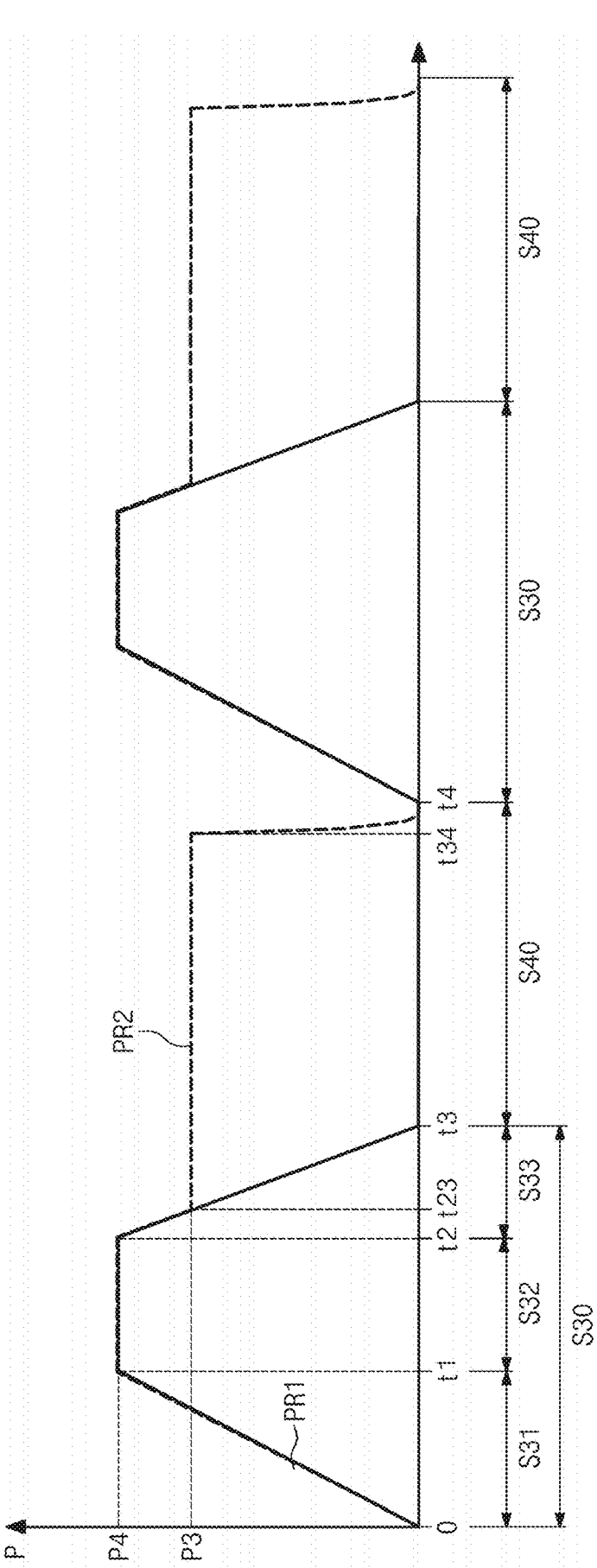
FIG. 14 is a graph illustrating another embodiment of the pressure change in the inner space of the chamber and the pressure change of the supply line while the substrate treating apparatus performs the drying step and the standby step after the drying step is performed.

In the above-described example, it has been described that the flow process S32 is a so-called pressure pulsing process that repeatedly changes the pressure of the inner space 511, but is not limited thereto. For example, as shown in FIG. 14, the flow process S32 may be a so-called continuous flow process in which the treating fluid is supplied to the inner space 511 and the treating fluid is discharged from the inner space 511 continuously, and the pressure in the inner space 511 is maintained.

The effects of the inventive concept are not limited to the above-mentioned effects, and the unmentioned effects can be clearly understood by those skilled in the art to which the inventive concept pertains from the specification and the accompanying drawings.

Although the preferred embodiment of the inventive concept has been illustrated and described until now, the inventive concept is not limited to the above-described specific embodiment, and it is noted that an ordinary person in the art, to which the inventive concept pertains, may be variously carry out the inventive concept without departing from the essence of the inventive concept claimed in the claims and the modifications should not be construed separately from the technical spirit or prospect of the inventive concept.

What is claimed is:

1. A substrate treating apparatus, comprising:
a chamber defining an inner space therein;
a fluid supply including a supply line and a fluid supply source, the supply line being configured to supply a treating fluid to the inner space, and the fluid supply source being configured to supply the treating fluid to the supply line;
a first exhaust being configured to exhaust the inner space;
a second exhaust being configured to exhaust the supply line; and
a controller configured to control the fluid supply, the first exhaust, and the second exhaust
such that a pressure of the supply line is maintained at or above a critical pressure of the treating fluid during at least one part of a standby phase, a substrate being outside the inner space during the standby phase,
wherein the controller is further configured to control
the fluid supply and the first exhaust to perform the standby phase, and a treating phase for treating the substrate, in turns;
the second exhaust such that the pressure of the supply line becomes a normal pressure by exhausting the supply line during a first time that is before the treating phase; and
the second exhaust such that a first length of time in the standby phase is longer than a second length of time in the standby phase, when the pressure of the supply line is maintained at a pressure above the critical pressure, the second length of time being a duration of time for the pressure of the supply line to become the normal pressure.

2. The substrate treating apparatus of claim 1, wherein the controller is configured to control the fluid supply such that the fluid supply source supplies the treating fluid to the supply line during the at least one part of the standby phase, when the pressure of the supply line is lower than the critical pressure.

3. The substrate treating apparatus of claim 1, wherein the fluid supply further includes a heater in the supply line, the heater being configured to heat the treating fluid within the supply line.

4. The substrate treating apparatus of claim 3, wherein the controller is further configured to control the fluid supply such that the heater continuously heats the supply line during the standby phase.

5. The substrate treating apparatus of claim 3, wherein the supply line includes
a main supply line connected to the fluid supply source;
a first supply line branching from the main supply line and connected to the chamber; and
a second supply line branching from the main supply line and connected to the chamber at a location different from the first supply line, and
wherein the fluid supply further includes
a main valve in the main supply line;
a first valve in the first supply line; and
a second valve in the second supply line, and
wherein the heater is installed between the main valve, the first valve, and the second valve.

6. The substrate treating apparatus of claim 5, wherein the heater is in the main supply line, the first supply line, and the second supply line, respectively.

7. The substrate treating apparatus of claim 1, wherein the controller further controls the fluid supply and the second exhaust such that the treating phase includes a pressurization phase for increasing a pressure of the inner space and a decompression phase for reducing the pressure of the inner space to a normal pressure after the pressurization phase, the pressure of the supply line being maintained at or greater than the critical pressure for at least a first part of the pressurization phase to at least a first part of the standby phase.

8. A substrate treating apparatus, comprising:

a chamber defining an inner space therein;

a fluid supply with a supply line and a heater, the supply line being configured to supply a treating fluid to the inner space, the heater being configured to heat the supply line;

a first exhaust configured to exhaust the inner space;

a second exhaust configured to exhaust the supply line; and a controller configured to control the fluid supply, the first exhaust, and the second exhaust such that the heater heats the supply line containing a remaining treating fluid during a first time, a substrate not being in the inner space during a standby phase, wherein the controller is further configured to control the fluid supply, the first exhaust, and the second exhaust to perform, a drying phase for drying a substrate with the treating fluid in the inner space, and the standby phase for standing by for an introduction of a substrate into the inner space during a second time, wherein the controller is further configured to control the fluid supply, the first exhaust, and the second exhaust such that a pressure of the supply line is maintained at a first pressure during the first time, wherein the controller is further configured to control the fluid supply such that the first pressure is at or above a critical pressure to maintain a supercritical state of the treating fluid in the supply line, wherein the controller is further configured to control the fluid supply and the first exhaust to perform the standby phase, and the drying phase, in turns;

the second exhaust such that the pressure of the supply line becomes a normal pressure by exhausting the supply line during a first time that is before the drying phase; and the second exhaust such that a first length of time in the standby phase is longer than a second length of time in the standby phase, when the pressure of the supply line is maintained at a pressure above the critical pressure, the second length of time being a duration of time for the pressure of the supply line to become the normal pressure.

9. The substrate treating apparatus of claim 8, wherein the controller is further configured to control the fluid supply to supply the treating fluid to the supply line when the pressure of the supply line is lower than the first pressure.

10. The substrate treating apparatus of claim 8, wherein the supply line includes a main supply line connected to a fluid supply source storing the treating fluid;

a first supply line branching from the main supply line and connected to the chamber; and a second supply line branching from the main supply line and connected to the chamber at a location different from the first supply line, and wherein the fluid supply further includes a main valve in the main supply line;

a first valve in the first supply line; and a second valve in the second supply line, and wherein the controller is further configured to control the fluid supply to close the main valve, the first valve, and the second valve during the drying phase so the main valve, the first valve, and the second valve are closed during least a first part of a time during the drying phase and during the second time.

11. A substrate treating apparatus for dry treating a substrate using a treating fluid in a supercritical state, the substrate treating apparatus comprising:

a chamber defining an inner space therein;

a fluid supply having a supply line configured to supply the treating fluid to the inner space;

a first exhaust configured to exhaust the inner space;

a second exhaust configured to exhaust the supply line; and a controller configured to control the fluid supply, the first exhaust, and the second exhaust, and wherein the fluid supply includes a fluid supply source configured to transfer the treating fluid to the supply line;

a heater installed at the supply line; and a valve installed at the supply line, and wherein the supply line includes a main supply line connected to the fluid supply source;

a first supply line branching from the main supply line; and a second supply line branching from the main supply line and connected to the first supply line at a position different from the first supply line, and wherein the fluid supply includes a main valve in the main supply line;

a first valve in the first supply line; and a second valve in the second supply line, and wherein the controller is configured to control the fluid supply, the first exhaust, and the second exhaust to perform a drying phase for drying the substrate with the treating fluid in the inner space; and a standby phase for standing by for an introduction of a substrate after the substrate is taken from the inner space, and the main valve, the first valve, and the second valve are closed during at least a first part of a time during the standby phase, wherein the controller is further configured to control the fluid supply, the first exhaust, and the second exhaust such that a pressure of the supply line having the treating fluid remaining therein between the main valve, the first valve, and the second valve is maintained at a first pressure, and wherein the fluid supply further includes a pressure sensor on a downstream side of the main valve and on an upstream side of the first valve or the second valve, and wherein the controller is further configured to control the fluid supply to open the main valve and supply the treating fluid through the supply line, when a pressure value measured by the pressure sensor is lower than the first pressure at a time when the main valve, the first valve, and second valve are closed.

12. The substrate treating apparatus of claim 11, wherein the heater is configured to heat the supply line having the treating fluid remaining therein between the main valve, the first valve, and the second valve.

13. The substrate treating apparatus of claim 11, wherein the heater is configured to heat the supply line while the standby phase is being performed.

14. A substrate treating apparatus of claim 11, wherein the controller is configured to control the fluid supply such that the first pressure is at or above a critical pressure to maintain a supercritical state of the treating fluid at the supply line.

*   *   *   *   *